United States Patent
Weng et al.

(10) Patent No.: US 9,704,543 B2
(45) Date of Patent: Jul. 11, 2017

(54) CHANNEL CONTROLLING DEVICE FOR IMPROVING DATA READING EFFICIENCY

(71) Applicant: Silicon Motion Inc., Hsinchu County (TW)

(72) Inventors: Chen-Yu Weng, Kaohsiung (TW); Wen-Kai Liu, Hsinchu County (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/252,227

(22) Filed: Aug. 31, 2016

(65) Prior Publication Data

US 2017/0069359 A1 Mar. 9, 2017

(30) Foreign Application Priority Data

Sep. 4, 2015 (TW) .............................. 104129265 A

(51) Int. Cl.
*G11C 7/00* (2006.01)
*G11C 7/10* (2006.01)

(52) U.S. Cl.
CPC .......... *G11C 7/1012* (2013.01); *G11C 7/1051* (2013.01)

(58) Field of Classification Search
CPC .... G11C 7/1006; G11C 7/1051; G11C 7/1078
USPC .......................... 365/189.02, 189.15, 189.17
See application file for complete search history.

(56) References Cited

U.S. PATENT DOCUMENTS

| 7,496,695 | B2 | 2/2009 | Go |
| 2012/0072677 | A1 | 3/2012 | Biswas |
| 2012/0263003 | A1* | 10/2012 | Sakakibara ....... G11C 11/40615 365/222 |
| 2014/0201471 | A1 | 7/2014 | Cutter |

FOREIGN PATENT DOCUMENTS

| TW | 200841351 | 10/2008 |
| TW | I420316 | 12/2013 |

* cited by examiner

*Primary Examiner* — Son Dinh
(74) *Attorney, Agent, or Firm* — Winston Hsu

(57) ABSTRACT

A channel controlling device includes: a multiplexing circuit coupled to a plurality of channels for selecting a specific channel from the channels to output a channel data according to a selecting signal, wherein the channels correspond to a plurality of predetermined digital numbers; a sorting circuit arranged to queue the predetermined digital numbers to form a plurality of queued digital numbers according to a data output order of the channels; and an arbitration circuit, arranged to determine the selecting signal according to the plurality of queued digital numbers.

19 Claims, 6 Drawing Sheets

US 9,704,543 B2

CHANNEL CONTROLLING DEVICE FOR IMPROVING DATA READING EFFICIENCY

BACKGROUND OF THE INVENTION

1. Field of the Invention

The present invention relates to a channel controlling device, and more particularly to a storage device control circuit capable of adjusting the data output order of a plurality of channels.

2. Description of the Prior Art

Developments in technology for storage devices have increased their data storage amount, thereby increasing the difficulty of reading data stored in the storage device. A plurality of data channels is utilized to increase the read speed of a flash memory, wherein the data read from the flash memory is decoded in advance, and then sent to a host. The decoder of the flash memory cannot receive data from multiple channels at the same time. An arbitration circuit is therefore utilized to determine an output order of multiple channels so the channels can be controlled to output data to the decoder according to the output order. The output order needs to be dynamically adjustable, however. For example, when the current output order is incorrect, the arbitration circuit should be capable of instantly correcting the output order. Hence, how to provide a storage device control circuit that can dynamically adjust the channel output data order is an issue to be solved in this field.

SUMMARY OF THE INVENTION

An objective of the present invention is to provide a storage device control circuit capable of adjusting the data output order of multiple channels. An embodiment of the present invention provides a channel controlling device. The channel controlling device comprises a multiplexing circuit, a sorting circuit and an arbitration circuit. The multiplexing circuit is coupled to a plurality of channels, and arranged to select a specific channel from the channels to output a channel data according to a selecting signal, wherein the channels correspond to a plurality of predetermined digital numbers, respectively. The sorting circuit is arranged to queue the predetermined digital numbers according to a data output order of the channels in order to form a plurality of queued digital numbers. The arbitration circuit is arranged to determine the selecting signal according to the queued digital numbers.

These and other objectives of the present invention will no doubt become obvious to those of ordinary skill in the art after reading the following detailed description of the preferred embodiment that is illustrated in the various figures and drawings.

DETAILED DESCRIPTION

Some phrases in the present specification and claims refer to specific elements; however, please note that the manufacturer might use different terms to refer to the same elements. Further, in the present specification and claims, the term "comprising" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Figure 1:
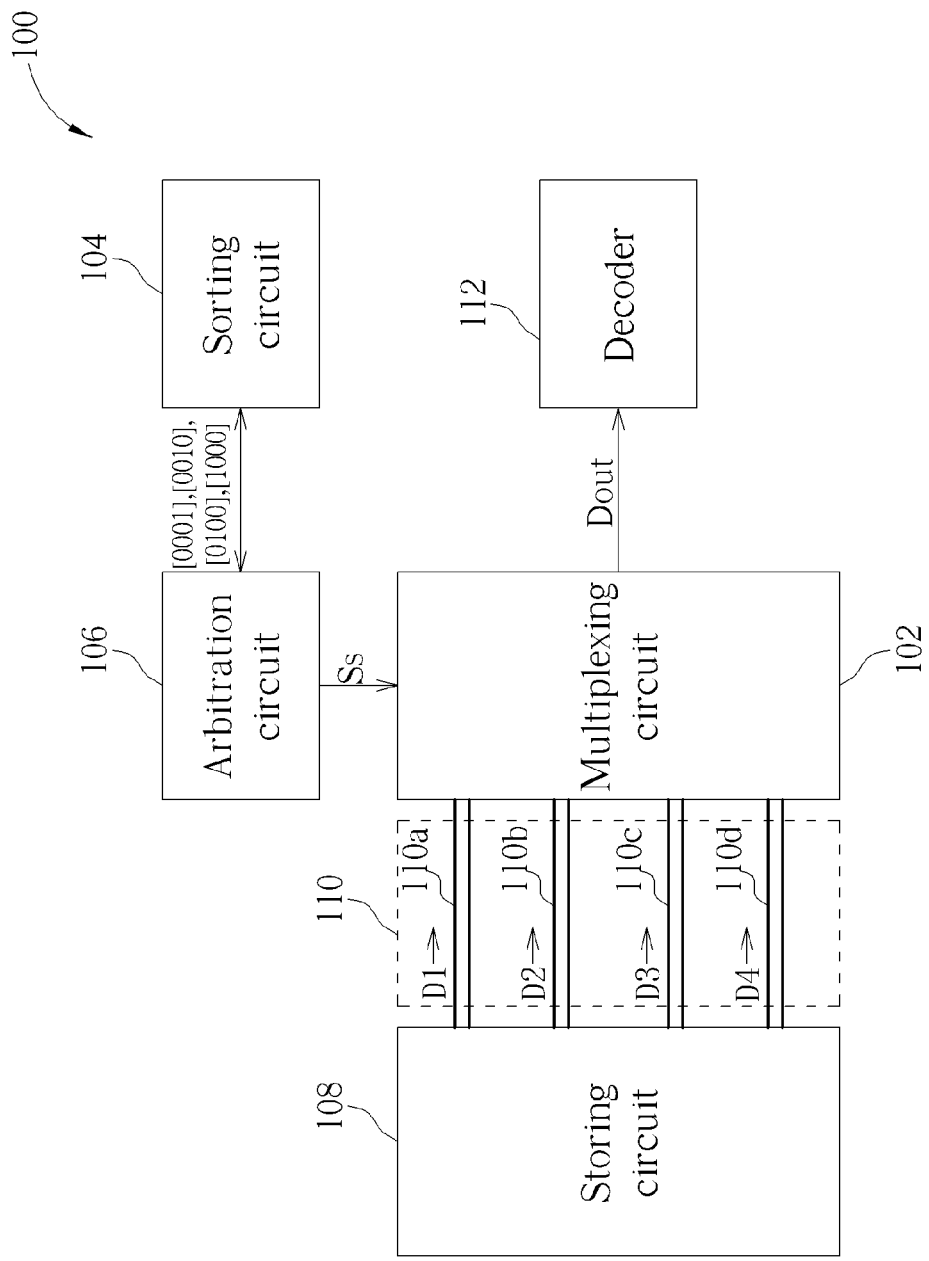
FIG. 1 is a diagram illustrating a channel controlling device according to an embodiment of the present invention.

FIG. 1 is a diagram illustrating a channel controlling device 100 according to an embodiment of the present invention. The channel controlling device 100 comprises the multiplexing circuit 102, a sorting circuit 104 and an arbitration circuit 106. In this embodiment, the channel controlling device 100 may be viewed as a plurality of channel controlling devices of a storing circuit. For better understanding of the operations of the channel controlling device 100 in this embodiment, FIG. 1 further shows a storing circuit 108 and a plurality of channels 110, wherein the channels 110 are coupled to the storing circuit 108, and the channels 110 are arranged to transmit/receive data of the storing circuit 108. The multiplexing circuit 102 is coupled to the channels 110, and arranged to refer to the selecting signal S for selecting a channel from the channels 110, in order to output a channel data Dout. The channels 110 correspond to a plurality of predetermined digital numbers, respectively. The sorting circuit 104 refers to the data output order of the channels 110 to queue the predetermined digital numbers, in order to form a plurality of queued digital numbers. The arbitration circuit 106 refers to the queued digital numbers to determine the selecting signal S. The channel data Dout is then transmitted to a decoder 112, and the decoded data outputted by the decoder 112 is transmitted to a host (not shown).

For better understanding, the channels 110 are assumed to comprise four channels 110a, 110b, 110c and 110d, but the present invention is not limited thereto, and the channels 110 may comprise more than four channels. Further, the channels 110a, 110b, 110c and 110d are represented by the predetermined digital numbers [0001], [0010], [0100] and [1000], respectively, wherein each predetermined digital number has four bits, wherein one bit amongst the four is 1, and the others are 0. For example, in the first predetermined digital number [0001] corresponding to the first channel 110a, the least significant bit (LSB) is 1, and the remaining higher significant bits are 0. In the second predetermined digital number [0010] corresponding to the second channel 110b, the least significant bit is 0, the second least significant bit is 1, and the remaining higher significant bits are 0. In the third predetermined digital number [0100] corresponding to the third channel 110c, the least significant bit and the second least significant bit are 0, the third least significant bit is 1, and the most significant bit (MSB) is 0. In the fourth predetermined digital number [1000] corresponding to the third channel 110d, the most significant bit is 1 and the remaining less significant bits are 0. Similarly, if the storing circuit 108 has five channels, each channel will be represented by five bits, wherein one bit within the five bits is 1, and the other bits are 0. In the present invention, the number of bits for presenting the predetermined digital number of each channel is equal to the channel number.

The sorting circuit 104 may further comprise a plurality of storing circuits 104a, 104b, 104c and 104d, wherein the storing circuits 104a, 104b, 104c and 104d refer to the data output order of the channels 110a, 110b, 110c and 110d for writing the predetermined digital numbers [0001], [0010], [0100] and [1000], respectively, to form the queued digital numbers. The number of the storing circuits 104a, 104b, 104c and 104d is equal to the number of the channels 110a, 110b, 110c and 110d in this embodiment.

Figure 2:
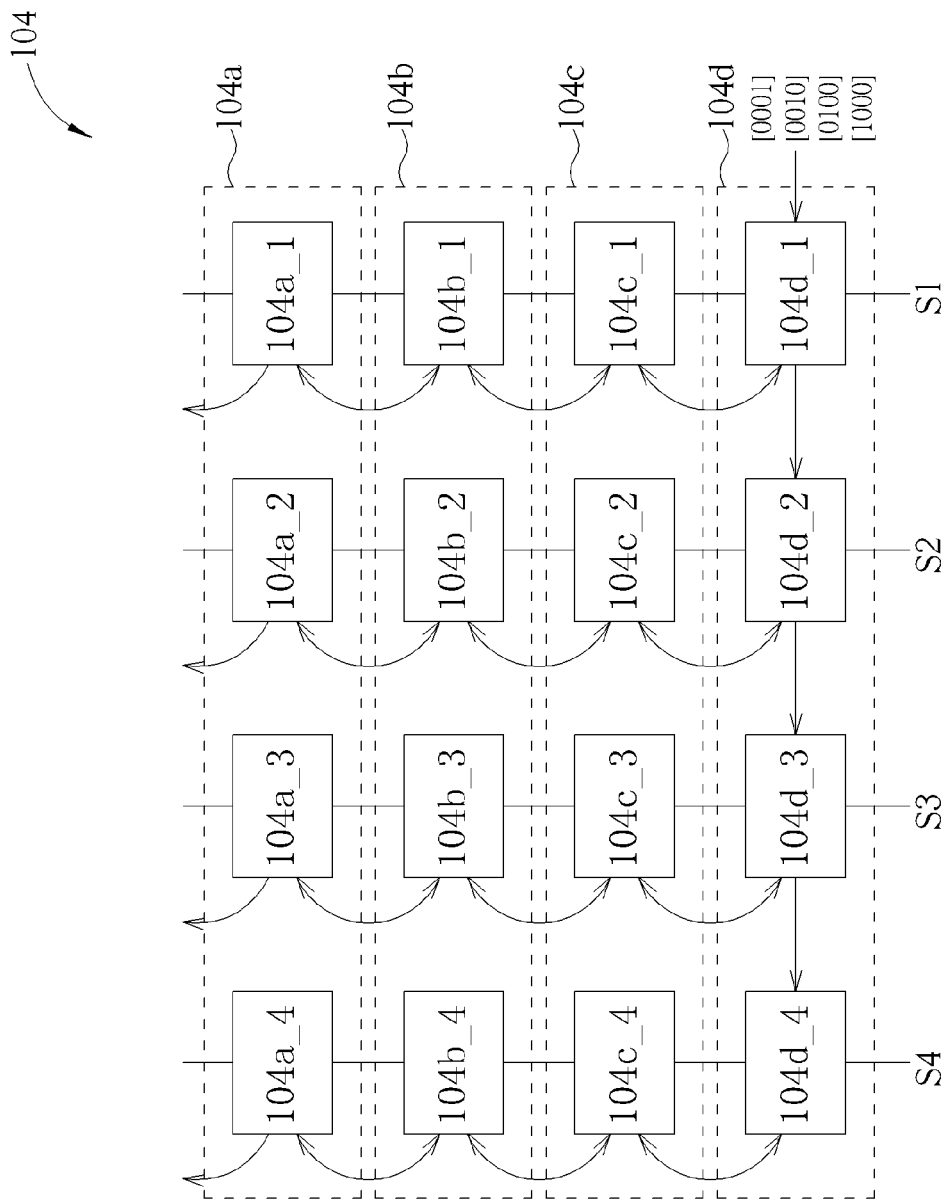
FIG. 2 is a diagram illustrating a sorting circuit according to an embodiment of the present invention.

FIG. 2 is a diagram illustrating a sorting circuit 104 according to an embodiment of the present invention. The sorting circuit 104 comprises four storing circuits 104a, 104b, 104c and 104d, each comprising a plurality of storage units, and the storing circuits 104a, 104b, 104c and 104d are arranged to store the bit values of a predetermined digital number. More specifically, in this embodiment, each storing circuit comprises four storage units, and each storage unit is arranged to store a bit value of a predetermined digital number. The number of storage units in each storing circuit is equal to the number of bits of the predetermined digital number. In this embodiment, the first storing circuit 104a comprises four storage units 104a_1, 104a_2, 104a_3 and 104a_4, the second storing circuit 104b comprises four storage units 104b_1, 104b_2, 104b_3 and 104b_4, the third storing circuit 104c comprises four storage units 104c_1, 104c_2, 104c_3 and 104c_4, and the fourth storing circuit 104d comprises four storage units 104d_1, 104d_2, 104d_3 and 104d_4. When the storage units 104a_1, 104a_2, 104a_3 and 104a_4 of the first storing circuit 104a store the first predetermined digital number [0001], the first storage unit 104a_1 is arranged to store the least significant bit [1] within [0001], the second storage unit 104a_2 is arranged to store the second least significant bit [0] within [0001], the third storage unit 104a_3 is arranged to store the third least significant bit [0] within [0001], and the fourth storage unit 104a_2 is arranged to store the most significant bit [0] within the predetermined digital number [0001]. Further, each of the storing circuits 104a, 104b, 104c and 104d can be used to store any of the predetermined digital numbers [0001], [0010], [0100] and [1000].

The storing circuits 104a, 104b, 104c and 104d in this embodiment are arranged in a matrix as shown in FIG. 2, wherein the first storing circuit 104a corresponds to a highest data output order, the second storing circuit 104b corresponds to a second highest data output order, the third storing circuit 104c corresponds to a third highest data output order, and the fourth storing circuit 104d corresponds to a lowest data output order. The first storing circuit 104a is arranged to write the predetermined digital number of a channel corresponding to a highest data output order, the second storing circuit 104b is arranged to write the predetermined digital number of a channel corresponding to a second highest data output order, the third storing circuit 104c is arranged to write the predetermined digital number of a channel corresponding to a third highest data output order, and the fourth storing circuit 104d is arranged to write the predetermined digital number of a channel corresponding to a lowest highest data output order. The arbitration circuit 106 reads the predetermined digital number (i.e. the predetermined digital number of the channel with the highest data output order) in the first storing circuit 104a to generate the selecting signal S, to make the channel with the highest data output order output the data thereof, i.e. the channel data D1, D2, D3 and D4 in the channels 110a, 110b, 110c and 110d.

The storing circuits 104a, 104b, 104c and 104d in this embodiment are further controlled by four eliminating signals S1, S2, S3 and S4, wherein the first eliminating signal S1 is coupled to the first storage unit 104a_1, the first storage unit 104b_1, the first storage unit 104c_1 and the first storage unit 104d_1; the second eliminating signal S2 is coupled to the second storage unit 104a_2, the second storage unit 104b_2, the second storage unit 104c_2 and the second storage unit 104d_2; the third eliminating signal S3 is coupled to the third storage unit 104a_3, the third storage unit 104b_3, the third storage unit 104c_3 and the third storage unit 104d_3; and the fourth eliminating signal S4 is coupled to the fourth storage unit 104a_4, the fourth storage unit 104b_4, the fourth storage unit 104c_4 and the fourth storage unit 104d_4. The first eliminating signal S1 is arranged to set the bit values in the first storage unit 104a_1, the first storage unit 104b_1, the first storage unit 104c_1 and the first storage unit 104d_1 to zero. The second eliminating signal S2 is arranged to set the bit values in the second storage unit 104a_2, the second storage unit 104b_2, the second storage unit 104c_2 and the second storage unit 104d_2 to zero. The third eliminating signal S3 is arranged to set the bit values in the third storage unit 104a_3, the third storage unit 104b_3, the third storage unit 104c_3 and the third storage unit 104d 3 to zero. The fourth eliminating signal S4 is arranged to set the bit values in the fourth storage unit 104a_4, the fourth storage unit 104b_4, the fourth storage unit 104c_4 and the fourth storage unit 104d_4 to zero.

Note that, in this embodiment, each of the storing circuits 104a, 104b, 104c and 104d may be implemented with a flip-flop, but the present invention is not limited thereto.

Referring to FIG. 2, when the arbitration circuit 106 writes the predetermined digital numbers [0001], [0010], [0100] and [1000] to the storing circuits 104a, 104b, 104c and 104d according to the data output order of the channels 110, the writing order starts from the fourth storing circuit 104d to the storing circuit 104a. Initially, the arbitration circuit 106 writes a first priority digital number (e.g. [1000]) corresponding to the channel having the highest data output order. After the first priority digital number is written to the fourth storing circuit 104d, the first priority digital number is transferred to the third storing circuit 104c. Then, the arbitration circuit 106 writes a second priority digital number (e.g. [0010]) corresponding to the channel having the second highest order to the fourth storing circuit 104d. After the second priority digital number is written to the fourth storing circuit 104d, the first priority digital number is transferred to the second storing circuit 104b, and the second priority digital number is transferred to the third storing circuit 104c. Then, the arbitration circuit 106 writes a third priority digital number (e.g. [0100]) corresponding to the channel having the third highest data output order to the fourth storing circuit 104d. After the third priority digital number is written to the fourth storing circuit 104d, the first priority digital number is transferred to the first storing circuit 104a, the second priority digital number is transferred to the second storing circuit 104b, and the third priority digital number is transferred to the third storing circuit 104c. Then, the arbitration circuit 106 writes a fourth priority digital number (e.g. [0001]) corresponding to the channel having the lowest data output order to the fourth storing circuit 104*d*. In this way, the arbitration circuit 106 may refer to the data output order of the channels 110 to write the predetermined digital numbers [0001], [0010], [0100] and [1000] to the storing circuits 104*a*, 104*b*, 104*c* and 104*d*. In this embodiment, the sequential order of the queued digital numbers is [1000], [0010], [0100] and [0001].

Figure 3:
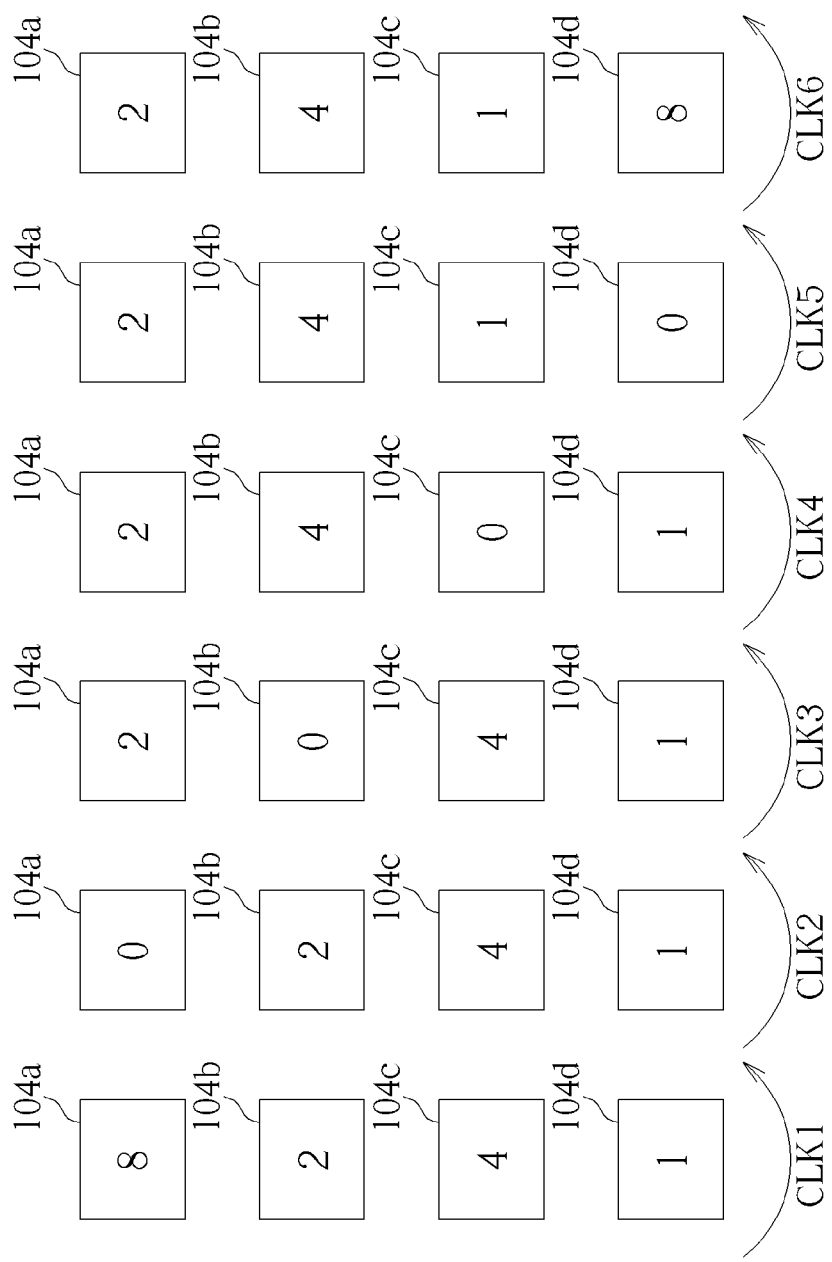
FIG. 3 is a diagram illustrating the change of a plurality of predetermined digital numbers stored in a plurality of storing circuits according to a first embodiment of the present invention.

Next, the arbitration circuit 106 reads the first priority digital number [1000] in the first storing circuit 104*a* to generate the selecting signal S for controlling the multiplexing circuit 102 to output the channel data D4 of the fourth channel 110*d*. FIG. 3 is a diagram illustrating the change of a plurality of predetermined digital numbers stored in the storing circuits 104*a*, 104*b*, 104*c* and 104*d* according to a first embodiment of the present invention. For better understanding, the binary digital numbers [1000], [0010], [0100] and [0001] stored in the storing circuits 104*a*, 104*b*, 104*c* and 104*d* (shown in FIG. 3) are represented by the decimal values 8, 2, 4 and 1, respectively. In the first period CLK1, the arbitration circuit 106 reads the digital number [1000] in the first storing circuit 104*a* to generate the selecting signal S for controlling the multiplexing circuit 102 to output the channel data D4 of the fourth channel 110*d* as the channel data Dout. In the second period CLK2, if the transmission of the channel data D4 in the fourth channel 110*d* is completed, the digital number [1000] in the first storing circuit 104*a* will be set to zero, (i.e. [0000]). Then, during the third period CLK3, the digital number [0010] previously stored in the second storing circuit 104*b* is transferred to the first storing circuit 104*a*, and the digital number [0010] is set to zero. Further, the arbitration circuit 106 will read the digital number [0010] in the first storing circuit 104*a* to generate the selecting signal S for controlling the multiplexing circuit 102 to the channel data D2 output of the second channel 110*b* as the channel data Dout. Similarly, during the fourth period CALK and the fifth period CALK, the digital number [0100] previously stored in the third storing circuit 104*c* and the digital number [0001] previously stored in the fourth storing circuit 104*d* can be transferred to the second storing circuit 104*b* and the third storing circuit 104*c*. During the fifth period CALK, the digital number of the fourth storing circuit 104*d* is set to zero. Then, during the sixth period CLK6, the arbitration circuit 106 writes the digital number [1000] corresponding to the fourth channel 110*d* to the fourth storing circuit 104*d*. In this embodiment, during the third period CLK3 to the sixth period CLK6, the arbitration circuit 106 continuously reads the digital number [0010] in the first storing circuit 104*a* to control the multiplexing circuit 102 to output the channel data D2 of the second channel 110*b* as the channel data Dout.

After the channel data D4 queued to the fourth channel 110*d* having the first priority is read during the first period CLK1, the digital number [1000] of the fourth channel 110*d* will be rewritten to the fourth storing circuit 104*d* having the lowest priority during the sixth period CLK6. The sorting circuit 104 of the present invention may effectively output the channel data D1, D2, D3 and D4 in the channels 110*a*, 110*b*, 110*c* and 110*d* according to a predetermined data output order.

In another example, after the arbitration circuit 106 refers to another data output order to write the predetermined digital numbers [0010], [0001], [0100] and [1000] to the storing circuits 104*a*, 104*b*, 104*c* and 104*d*, if a signal from a host (not shown in the figure) indicates that errors occur in the aforementioned data output order, the sorting circuit 104 of the present invention may instantly delete any predetermined digital number in the storing circuits 104*a*, 104*b*, 104*c* and 104*d*.

Figure 4:
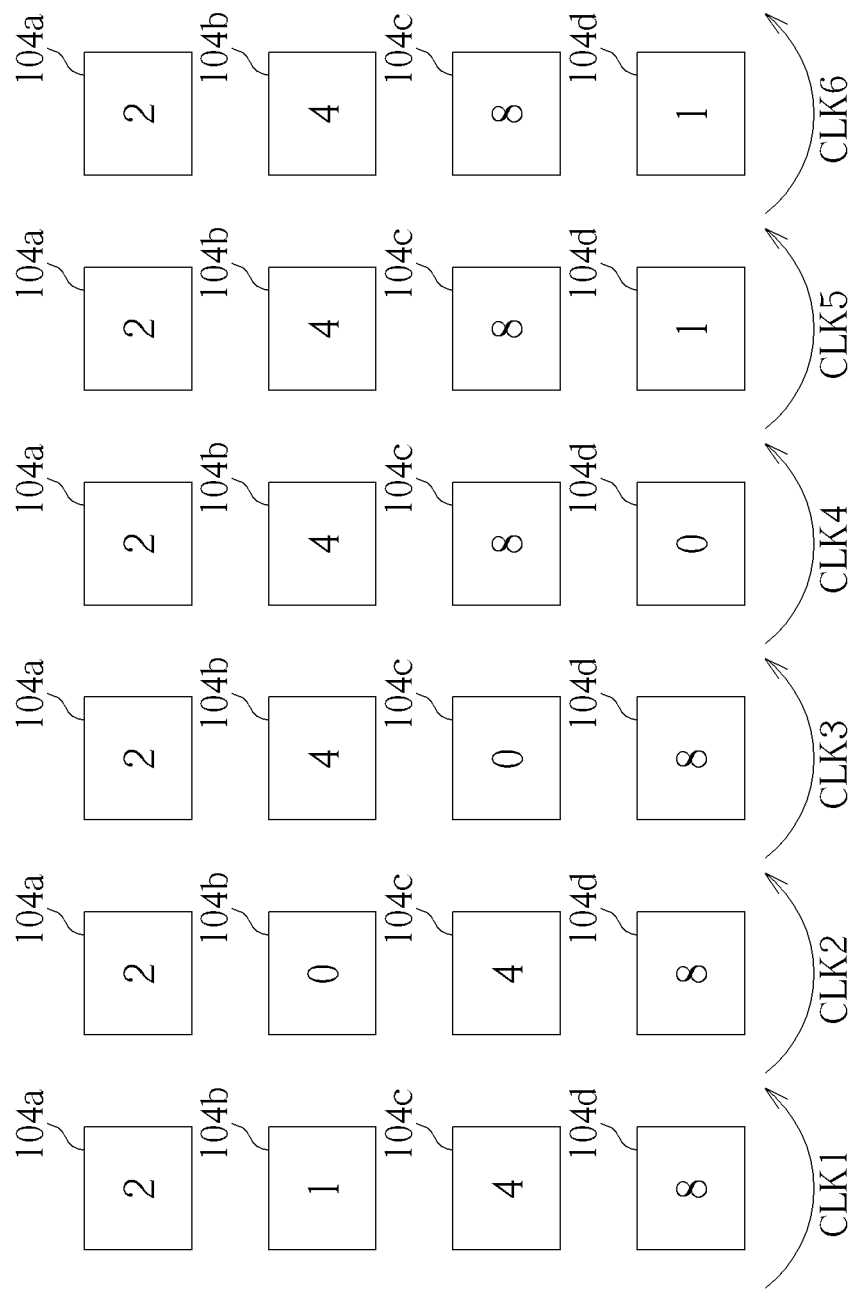
FIG. 4 is a diagram illustrating the change of a plurality of predetermined digital numbers stored in a plurality of storing circuits according to a second embodiment of the present invention.

FIG. 4 is a diagram illustrating the change of a plurality of predetermined digital numbers stored in the storing circuits 104*a*, 104*b*, 104*c* and 104*d* according to a second embodiment of the present invention. For better understanding, the binary digital numbers [0001], [0100] and [1000] stored in the storing circuits 104*a*, 104*b*, 104*c* and 104*d* shown in FIG. 4 are represented by the decimal values 2, 1, 4, 8. For example, in the second period CLK2, when a signal from a host (not shown) indicates that errors occur in the digital number [0001] stored in the second storing circuit 104*b*, the host will directly utilize the first eliminating signal S1 previously described in FIG. 2 to set the bit values stored in the first storage unit 104*b*_1 of the second storing circuit 104*b* to zero, i.e. by switching the bits 1 previously stored in the first storage unit 104*b*_1 to 0.

Through utilizing the method proposed in FIG. 4 of the present invention, in the third period CLK3 and fourth period CLK4, the digital number [0100] previously stored in the third storing circuit 104*c* can be transferred to the second storing circuit 104*b*, and the digital number [1000] previously stored in the fourth storing circuit 104*d* can be transferred to the third storing circuit 104*c*. In the fourth period CLK4, the digital number of the fourth storing circuit 104*d* is set to zero. In the fifth period CLK5, the arbitration circuit 106 writes the digital number [0001] corresponding to the first channel 110*a* to the fourth storing circuit 104*d*. In this embodiment, during the first period CLK1 to the sixth period CLK6, the arbitration circuit 106 keeps reading the digital number [0010] in the first storing circuit 104*a* to control the multiplexing circuit 102 to output the channel data D2 of the second channel 110*b* as the channel data Dout. In other words, the arbitration circuit 106 may read the digital number in the first storing circuit 104*a* to output the channel data, while the sorting circuit 104 removes the digital number stored in the storing circuit 104*b* (or 104*c*, 104*d*), Compared with related arts, the channel controlling device 100 of the present invention has higher data reading efficiency.

Figure 5:
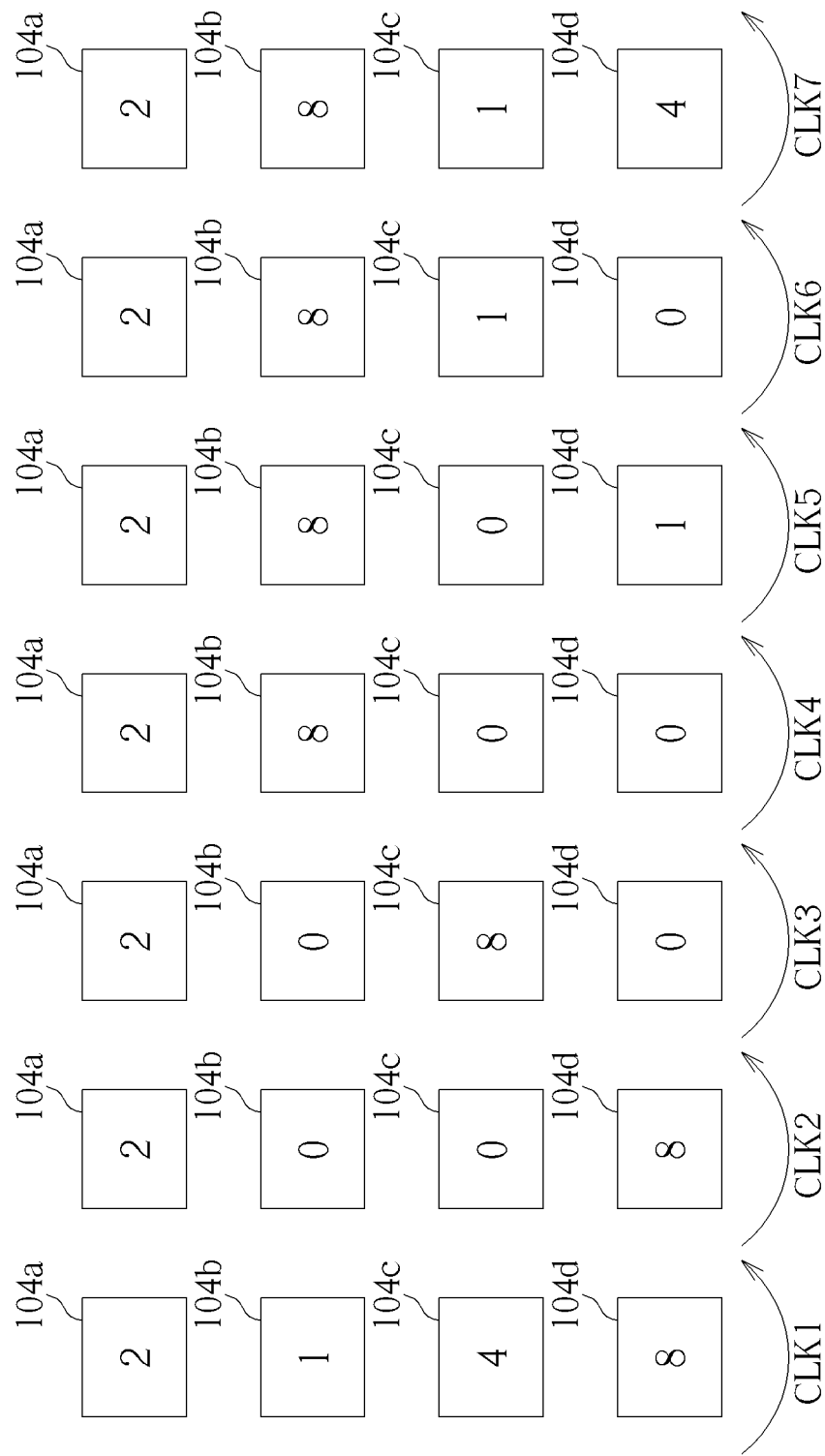
FIG. 5 is a diagram illustrating the change of a plurality of predetermined digital numbers stored in a plurality of storing circuits according to a third embodiment of the present invention.

In another example, after the arbitration circuit 106 refers to the data output order to write the predetermined digital numbers [0001], [0100] and [1000] to the storing circuits 104*a*, 104*b*, 104*c* and 104*d*, if a signal from a host (not shown) indicates that errors occur in two or more digital numbers in the sorting circuit 104, the sorting circuit 104 can instantly remove the digital numbers in multiple storing circuits. FIG. 5 is a diagram illustrating the change of a plurality of predetermined digital numbers stored in the storing circuits 104*a*, 104*b*, 104*c* and 104*d* according to a third embodiment of the present invention. For better understanding, the binary digital numbers [0010], [0001], [0100] and [1000] stored in the storing circuits 104*a*, 104*b*, 104*c* and 104*d*, respectively, are represented by decimal values 2, 1, 4, 8. For example, in the second period CLK2, when a signal from a host (not shown) indicates that errors occur in the digital numbers [0001] and [0100] stored in the second storing circuit 104*b* and the third storing circuit 104*c*, the host will directly utilize the first eliminating signal S1 and the third eliminating signal S3 shown in FIG. 2 to set the bit values stored in the first storage unit 104*b*_1 of the second storing circuit 104*b* and the third storage unit 104*c*_3 of the third storing circuit 104*c* to zero, i.e. by switching the bits 1 stored in the first storage unit 104*b*_1 and third storage unit 104*c*_3 to 0.

By utilizing the method provided by FIG. 5, in the third period CLK3, the digital number [1000] previously stored in the fourth storing circuit 104d is transferred to the third storing circuit 104c. At this time (during the third period CLK3), the digital number of the second storing circuit 104b is 0, and the digital number in the fourth storing circuit 104d will be set to 0. In the fourth period CLK4, the digital number [1000] stored in the third storing circuit 104c is transferred to the second storing circuit 104b, and the digital number stored in the third storing circuit 104c is set to 0. In the fifth period CLK5, the arbitration circuit 106 writes the digital number [0001] corresponding to the first channel 110a to the fourth storing circuit 104d. In the sixth period CLK6, the digital number [0001] stored in the fourth storing circuit 104d is transferred to the second storing circuit 104b, and the digital number stored in the fourth storing circuit 104d is set to zero. In the period CLK7, the arbitration circuit 106 writes the digital number [0100] corresponding to the third channel 110c to the fourth storing circuit 104d. In this embodiment, during the first period CLK1 to the sixth period CLK7, the arbitration circuit 106 continuously reads the digital number [0010] in the first storing circuit 104a to control the multiplexing circuit 102 to output the channel data D2 of the second channel 110b as the channel data Dout. The arbitration circuit 106 may read the digital number in the first storing circuit 104a to output the channel data, while the sorting circuit 104 removes the digital numbers stored in the storing circuits 104b and 104c (or 104d). Compared with related arts, the channel controlling device 100 of the present invention has higher data reading efficiency.

Figure 6:
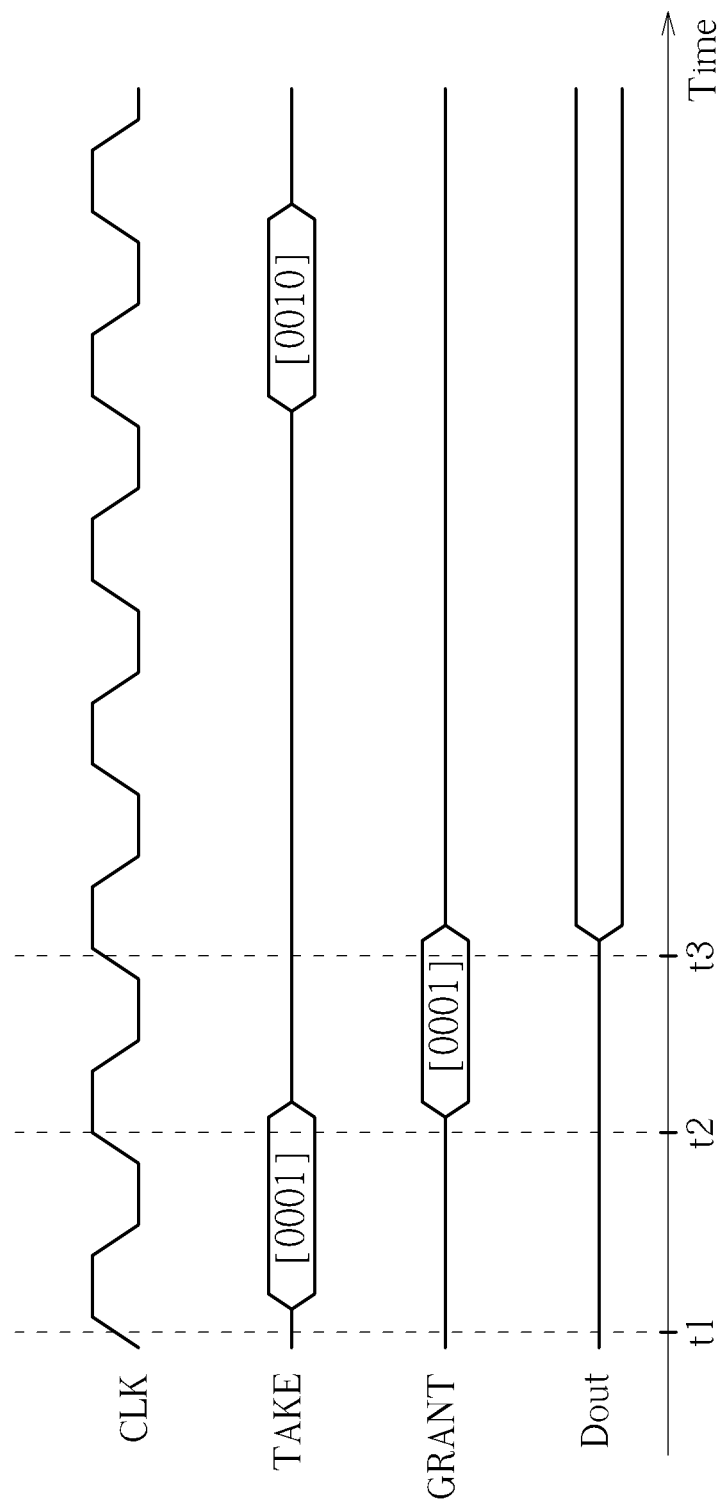
FIG. 6 is a timing diagram illustrating the operation of reading a channel data according to an embodiment of the present invention.

FIG. 6 is a timing diagram illustrating the operation of reading a channel data according to an embodiment of the present invention. An example of reading the first channel data D1 of the first channel 110a is illustrated. FIG. 6 comprises a clock signal CLK, a requesting signal TAKE, a granting signal GRANT and the channel data Dout. In this embodiment, it is assumed that the predetermined digital number [0001] corresponding to the first channel 110a is already stored in the storing circuit 104a. Hence, when a host sends a requesting signal TAKE to the channel controlling device 100 at t1 to read the first channel data D1 of the first channel 110a, the arbitration circuit 106 in the channel controlling device 100 will check whether the predetermined digital number [0001] is stored in the storing circuit 104a. When the arbitration circuit 106 detects that the predetermined digital number [0001] is stored in the storing circuit 104a, the arbitration circuit 106 will send the granting signal GRANT to the host at the next period (i.e. t2). After the host receives the granting signal GRANT, at the next period (i.e. t3), the arbitration circuit 106 controls the multiplexing circuit 102 to output the first channel data D1 of first channel 110a as the channel data Dout. When a host sends the requesting signal TAKE to the channel controlling device 100 to read the data of the channel having the highest priority, the channel controlling device 100 will output the correct channel data Dout in the third period at the earliest after receiving the requesting signal TAKE. The channel controlling device 100 of the present invention is thereby provided with a fast channel selection speed.

Through utilizing the sorting circuit 104 of the present invention, the channel controlling device 100 may output data of multiple channels according to a predetermined data output order, and may instantly adjust the predetermined data output order to make the channel controlling device 100 have a faster channel selection speed and higher data reading efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A channel controlling device, comprising:
   a multiplexing circuit, coupled to a plurality of channels, the multiplexing circuit arranged to select a specific channel from the channels to output a channel data according to a selecting signal, wherein the channels correspond to a plurality of predetermined digital numbers, respectively;
   a sorting circuit, arranged to queue the predetermined digital numbers according to a data output order of the channels, to form a plurality of queued digital numbers; and
   an arbitration circuit, arranged to determine the selecting signal according to the queued digital numbers.

2. The channel controlling device of claim 1, wherein the arbitration circuit generates the selecting signal according to a predetermined digital number within the queued digital numbers that has a highest priority.

3. The channel controlling device of claim 1, wherein the sorting circuit comprises:
   a plurality of storing circuits, arranged to refer to the data output order of the channels to write the predetermined digital numbers, in order to form the queued digital numbers.

4. The channel controlling device of claim 3, wherein the number of the storing circuits is equal to the number of the channels.

5. The channel controlling device of claim 3, wherein the storing circuits at least comprise:
   a first storing circuit, arranged to write a first predetermined digital number corresponding to a first channel having a higher data output order; and
   a second storing circuit, arranged to write a second predetermined digital number corresponding to a second channel having a lower data output order;
   wherein the arbitration circuit utilizes the first predetermined digital number to generate the selecting signal in advance, to make the first channel output the channel data.

6. The channel controlling device of claim 5, wherein after the first channel outputs the channel data, the first predetermined digital number in the first storing circuit is set to zero; and
   after the first predetermined digital number in the first storing circuit is set to zero, the second predetermined digital number previously stored in the second storing circuit is written to the first storing circuit.

7. The channel controlling device of claim 6, wherein after the second predetermined digital number previously stored in the second storing circuit is written to the first storing circuit, the arbitration circuit utilizes the second predetermined digital number in the first storing circuit to generate the selecting signal, to make the second channel output the channel data.

8. The channel controlling device of claim 6, wherein after the second predetermined digital number previously stored in the second storing circuit is written to the first storing circuit, the second predetermined digital number in the second storing circuit is set to zero.

9. The channel controlling device of claim 8, wherein the storing circuits further comprise:

a third storing circuit, arranged to write a third predetermined digital number corresponding to a third channel having a higher data output order;

wherein after the second predetermined digital number in the second storing circuit is set to zero, the third predetermined digital number previously stored in the third storing circuit is written to the second storing circuit.

10. The channel controlling device of claim 3, wherein when a first predetermined digital number within the storing circuits stored by first storing circuit is required to be reset, the first predetermined digital number stored in the first storing circuit is set to zero in advance.

11. The channel controlling device of claim 10, wherein after the first predetermined digital number stored in the first storing circuit is set to zero, a second predetermined digital number previously stored in a second storing circuit within the storing circuits is written to the first storing circuit, and the second predetermined digital number in the second storing circuit is set to zero.

12. The channel controlling device of claim 11, wherein a data output order corresponding to the first storing circuit is higher than a data output order corresponding to the second storing circuit.

13. The channel controlling device of claim 3, wherein when a first predetermined digital number and a second predetermined digital number respectively stored in a first storing circuit and a second storing circuit within the storing circuits are required to be reset, the first predetermined digital number and the second predetermined digital number respectively stored in the first storing circuit and the second storing circuit are set to zero in advance.

14. The channel controlling device of claim 13, wherein after the first predetermined digital number and the second predetermined digital number respectively stored in the first storing circuit and the second storing circuit are set to zero, a third predetermined digital number previously stored in a third storing circuit within the storing circuits is written to the second storing circuit, and the third predetermined digital number in the third storing circuit is set to zero.

15. The channel controlling device of claim 14, wherein after the third predetermined digital number previously stored in the third storing circuit is written to the second storing circuit, and the third predetermined digital number in the third storing circuit is set to zero, the third predetermined digital number stored in the first storing circuit and the third predetermined digital number in the second storing circuit are set to zero.

16. The channel controlling device of claim 15, wherein a data output order corresponding to the first storing circuit is higher than a data output order corresponding to the second storing circuit, and the data output order corresponding to the second storing circuit is higher than a data output order corresponding to the third storing circuit.

17. The channel controlling device of claim 3, wherein each predetermined digital number within the predetermined digital numbers comprises a plurality of bit values, and each storing circuit within the storing circuits comprises:

a plurality of storage units, arranged to store the bit values.

18. The channel controlling device of claim 17, wherein only one bit value within the bit values is 1, and rest of the bit values are 0.

19. The channel controlling device of claim 17, wherein the storage units are controlled by a plurality of eliminating signals, wherein the eliminating signals are arranged to set any bit within the storage units to zero.

* * * * *